United States Patent
Ding et al.

(10) Patent No.: US 11,676,937 B2
(45) Date of Patent: Jun. 13, 2023

(54) FLEXIBLE SINTER TOOL FOR BONDING SEMICONDUCTOR DEVICES

(71) Applicant: ASMPT SINGAPORE PTE, LTD., Singapore (SG)

(72) Inventors: Jiapei Ding, Singapore (SG); Rolan Ocuaman Camba, Singapore (SG); Teng Hock Kuah, Singapore (SG); Jian Liao, Singapore (SG); Kar Weng Yan, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 50 days.

(21) Appl. No.: 17/307,028

(22) Filed: May 4, 2021

(65) Prior Publication Data
US 2022/0359459 A1    Nov. 10, 2022

(51) Int. Cl.
*H01L 23/00* (2006.01)
*H01L 25/07* (2006.01)

(52) U.S. Cl.
CPC ............ *H01L 24/83* (2013.01); *H01L 25/072* (2013.01); *H01L 2224/8384* (2013.01)

(58) Field of Classification Search
CPC .................. H01L 24/83; H01L 25/072; H01L 2224/8384; H01L 2224/7555; H01L 2224/7655; H01L 2224/76655; H01L 2224/75821; H01L 2224/7592; H01L 2224/76986–77988; H01L 2224/76301–76303; H01L 2224/75986; H01L 2224/75988; H01L 2224/80; H01L 2224/80085
See application file for complete search history.

(56) References Cited

U.S. PATENT DOCUMENTS

| | | | |
|---|---|---|---|
| 2004/0121576 A1* | 6/2004 | Su | H01L 24/11 257/E21.511 |
| 2005/0277244 A1 | 12/2005 | Galster et al. | |
| 2007/0131353 A1 | 6/2007 | Gobi | |
| 2008/0035274 A1 | 2/2008 | Kanisawa | |
| 2014/0263581 A1 | 9/2014 | Shiratori et al. | |
| 2017/0144246 A1 | 5/2017 | Bogen et al. | |

FOREIGN PATENT DOCUMENTS

NL    2015895 B1    6/2017

OTHER PUBLICATIONS

European Search Report, dated Sep. 20, 2022, issued in corresponding European Patent Application No. 22168105.9.

* cited by examiner

*Primary Examiner* — Julio J Maldonado
*Assistant Examiner* — Stanetta D Isaac
(74) *Attorney, Agent, or Firm* — Ostrolenk Faber LLP (57) ABSTRACT

An apparatus having a seal plate which includes rigid hard portions and one or more flexible soft portions located between the hard portions is used for bonding at least one semiconductor device onto a substrate that is supported on a platform. The seal plate is movable between a first position which is spaced from the substrate and a second position whereat a first side of the seal plate is configured to be in contact with the substrate. A diaphragm covers a second side of the seal plate opposite to the first side. A fluid pressure generator exerts a fluid pressure onto the diaphragm to actuate the diaphragm to compress the one or more soft portions to transmit a bonding force onto the at least one semiconductor device during bonding.

18 Claims, 8 Drawing Sheets

FLEXIBLE SINTER TOOL FOR BONDING SEMICONDUCTOR DEVICES

FIELD OF INVENTION

The invention relates to an apparatus for bonding or sintering a semiconductor device.

BACKGROUND AND PRIOR ART

Sinter tools are used for sintering or bonding semiconductor devices during the manufacture of electronic devices. The sinter tools used are typically of a rigid and hard material. The sinter tool is typically made from a metal, and its hard metallic surface presses onto the semiconductor devices during sintering to bond the semiconductor devices onto a substrate under heat and pressure.

Figure 1A:
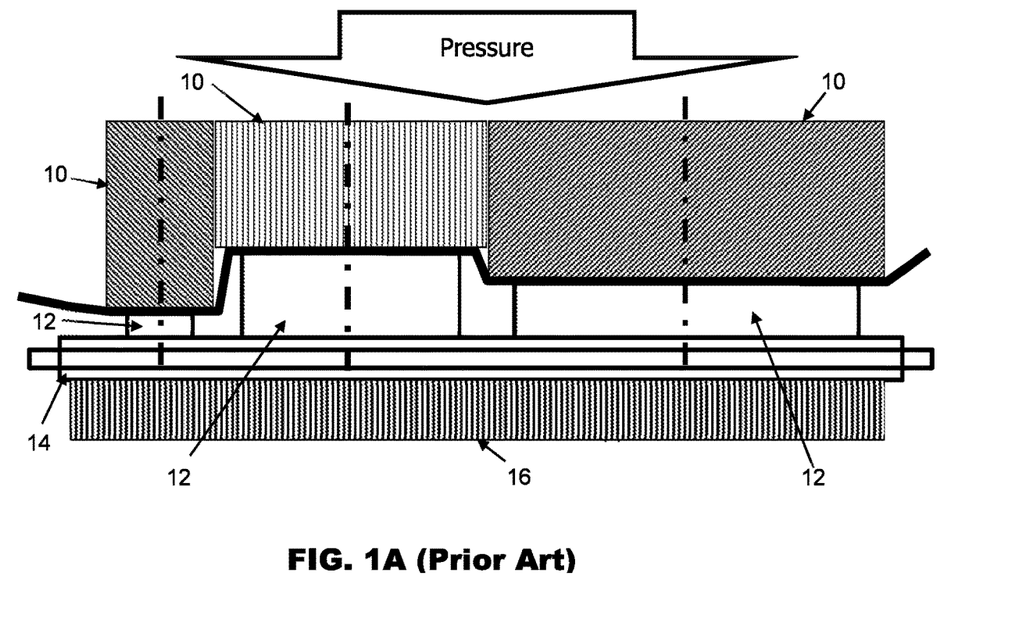
FIG. 1A is a side view of a bonding apparatus according to the prior art.

FIG. 1A shows a prior art hard sinter tool used in bonding semiconductor devices. Several semiconductor devices 12, each having a different height and width, are placed onto a substrate 14 that is supported on a platform 16. A plurality of hard sinter tools 10 are positioned above each semiconductor device 12. Each hard sinter tool 10 has a different width and thickness and is arranged to be positioned above each corresponding semiconductor device 12 according to its height. Under the application of suitable pressure and heat, the semiconductor devices 12 are then bonded to the substrate 14. A problem faced when using hard sinter tools in sintering is that tools having different sizes are needed to cater for semiconductor devices having different heights and widths. This would slow the entire bonding process as the hard sinter tools have to be manually changed to suit the size of each semiconductor device placed on the substrate.

Further, due to the different thickness and width of each hard sinter tool used, it is difficult to apply uniform pressure to each semiconductor device. This would affect the overall bonding quality of the semiconductor devices, and may lead to shorter life spans or failures. Furthermore, when using hard sinter tools, a certain portion of a fillet of sintering material, which is located outside a perimeter of a bottom edge of a semiconductor device, or is squeezed out from underneath the semiconductor device, would not be subject to sintering pressure during bonding. This may again result in a poor bonding quality and/or the quality of the bonded product, which might be prone to failure under stress.

Moreover, there are instances where a user needs to selectively apply sintering pressure to a specific area or areas. Using the hard sinter tools of the prior art, pressure selectivity at specific areas is not possible.

Figure 1B:
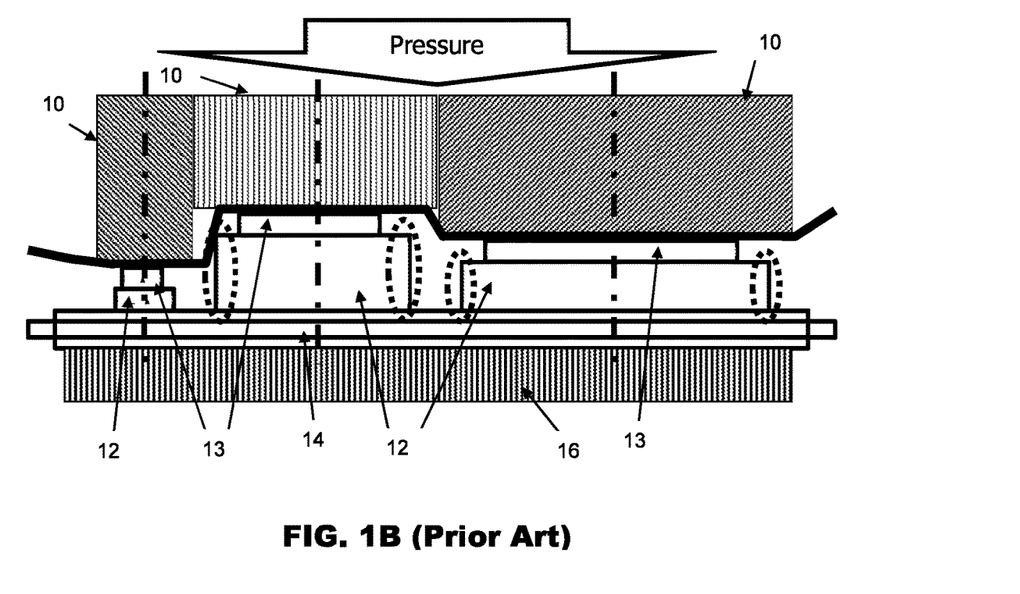
FIG. 1B is a side view of a bonding apparatus of FIG. 1A when bonding stacked semiconductor devices.

Another difficulty faced when using the hard sinter tools is that it would not be possible to perform sintering in a single step for stacked semiconductor devices. As shown in the prior art example of a hard sinter tool provided in FIG. 1B, a Die Top System (DTS) chip 13 is mounted on top of each semiconductor device 12. A first step of the bonding process is carried out by bonding the semiconductor device 12 to the substrate 14. A second step of the bonding process is then carried out by bonding each DTS chip 13 onto a separate semiconductor device 12. Hence, a two-step process must be carried out for bonding such stacked semiconductor devices. This process is time-consuming. Moreover, the corners 18 of each semiconductor device 12 (identified with dotted lines in FIG. 1B) tend to suffer from poor sintering quality.

SUMMARY OF THE INVENTION

It is thus an object of the invention to seek to provide an apparatus for bonding semiconductor devices onto substrates to improve the process of applying sintering pressure across semiconductor devices, especially for bonding stacked semiconductor devices having different thicknesses simultaneously.

According to a first aspect of the invention, there is provided an apparatus for bonding at least one semiconductor device onto a substrate that is supported on a platform, the apparatus comprising: a seal plate including rigid hard portions and one or more flexible soft portions located between the hard portions, the seal plate being movable between a first position which is spaced from the substrate, and a second position whereat a first side of the seal plate is configured to be in contact with the substrate; a diaphragm covering a second side of the seal plate opposite to the first side; a fluid pressure generator that is in fluid communication with the diaphragm, the fluid pressure generator being operative to exert a fluid pressure onto the diaphragm, the fluid pressure being further operative to actuate the diaphragm to compress the one or more soft portions, whereby to contact the at least one semiconductor device with the one or more soft portions and to apply a bonding force onto the at least one semiconductor device during bonding.

According to a second aspect of the invention, there is provided a method of bonding at least one semiconductor device onto a substrate that is supported on a platform, the method comprising the steps of: arranging the at least one semiconductor device on the substrate; moving a seal plate including rigid hard portions and one or more flexible soft portions located between the hard portions from a first position which is spaced from the substrate to a second position whereat a first side of the seal plate is in contact with the substrate; generating a fluid pressure with a fluid pressure generator onto a diaphragm covering a second side of the seal plate opposite to the first side, the fluid pressure generator being in fluid communication with the diaphragm; wherein the fluid pressure exerted onto the diaphragm actuates the diaphragm to compress the one or more soft portions, whereby to contact the at least one semiconductor device with the one or more soft portions and to apply a bonding force onto the at least one semiconductor device during bonding.

According to a third aspect of the invention, there is provided a method of manufacturing an electronic device comprising at least one semiconductor device that is bonded onto a substrate, the method comprising the steps of: arranging the at least one semiconductor device on the substrate; moving a seal plate including rigid hard portions and one or more flexible soft portions located between the hard portions from a first position which is spaced from the substrate to a second position whereat a first side of the seal plate is in contact with the substrate; generating a fluid pressure with a fluid pressure generator onto a diaphragm covering a second side of the seal plate opposite to the first side, the fluid pressure generator being in fluid communication with the diaphragm; wherein the fluid pressure exerted onto the diaphragm actuates the diaphragm to compress the one or more soft portions, whereby to contact the at least one semiconductor device with the one or more soft portions and to apply a bonding force onto the at least one semiconductor device during bonding.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary apparatus for bonding semiconductor device onto a substrate in accordance with the invention will now be described with reference to the accompanying drawings, in which.

The invention described herein is susceptible to variations, modifications and/or additions other than those specifically described and it is to be understood that the invention includes all such variations, modifications and/or additions which fall within the spirit and scope of the above description.

DETAILED DESCRIPTION OF THE PREFERRED EMBODIMENT OF THE INVENTION

Figure 2:
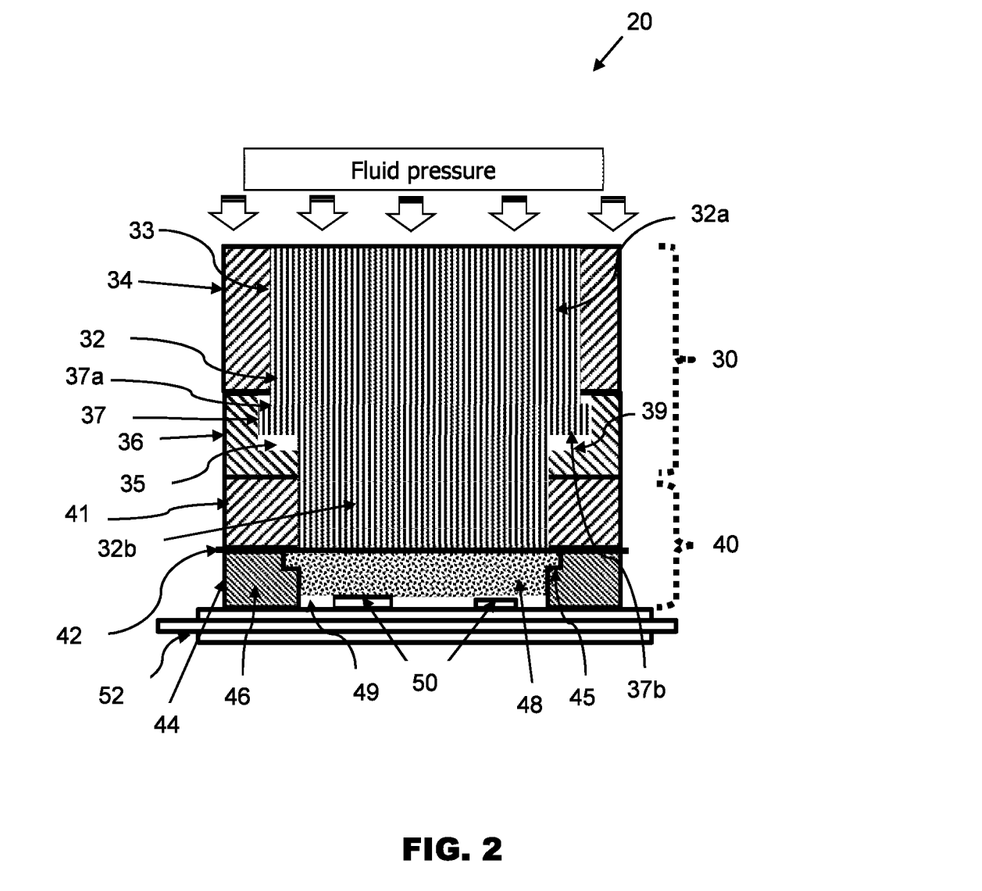
FIG. 2 is a side view of an apparatus for bonding semiconductor devices to a substrate according to a first preferred embodiment of the invention.

FIG. 2 is a schematic side view of an apparatus 20 for bonding semiconductor devices to a substrate according to a first preferred embodiment of the invention. The apparatus 20 generally includes a stamp holder assembly 30 and a seal plate assembly 40.

The stamp holder assembly 30 may comprise one or more stamps 32. The stamps 32 may be arranged in any suitable manner, such as in a regular matrix or in any other suitable pattern. Each stamp 32 may have an upper portion 32a which is acted upon by a pressure generator, and a lower portion 32b below the upper portion 32a. The lower portion 32b of the stamp 32 is proximate the seal plate assembly 40 and is operative to contact a diaphragm 42. Preferably, the upper portion 32a has a larger surface area than the lower portion 32b. This advantageously allows enhancement of the pressure exerted on the seal plate assembly 40.

The stamp holder assembly 30 may further comprise a stamp holder sleeve 34 and a stamp holder body 36. The stamp holder sleeve 34 has one or more slots 33 that is adapted to receive and guide the upper portion 32a of each stamp 32. The stamp holder body 36 is mounted beneath the stamp holder sleeve 34 and has a recess 35 that is adapted to allow sliding movement of the upper portion 32a of the stamp 32.

A collar 37 extends horizontally form the stamp 32 and surrounds a base of the upper portion 32a of the stamp 32. The stamp 32 is configured to be movable in vertical directions towards and away from a substrate 52. The collar 37 being located within the recess 35 delimits the range of motion of the stamp 32. During the movement of the stamp 32 vertically away from the substrate 52, a top face 37a of the collar 37 will contact a bottom face of the stamp holder sleeve 34 or a top surface of the recess 36, thus preventing the stamp 32 from moving further upwards. When the stamp 32 is moving vertically downwards towards the substrate 52, a bottom face 37b of the collar 37 will be stopped when it contacts a base 39 or bottom surface of the recess 35. The collar 37 thus limits the range of motion of the stamp 32 relative to the substrate 52.

The seal plate assembly 40 is located between the stamp holder assembly 30 and the substrate 52. The seal plate assembly 40 includes a seal plate shoulder 41 mounted below the stamp holder body 36. The seal plate shoulder 41 has a through hole arranged to receive the lower portion 32b of the stamp 32. The arrangement of the stamp holder assembly 30 and the seal plate assembly 40 is illustrated in more detail in FIG. 3.

Figure 3:
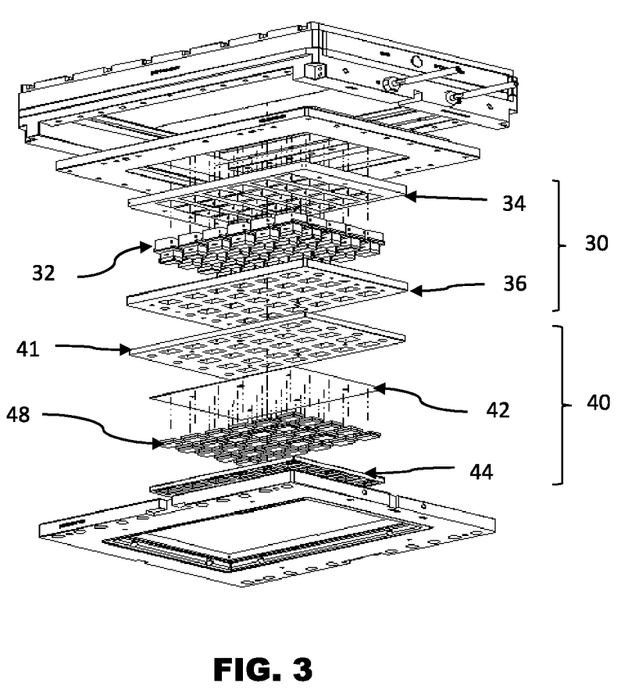
FIG. 3 is an exploded isometric view of a stamp holder assembly and a seal plate assembly according to a first preferred embodiment of the invention.

The seal plate assembly 40 further comprises a seal plate 44 located under the seal plate shoulder 41. The seal plate 44 has an opening to receive a seal insert 46. The seal insert 46 has a cutout 49 that is suitably sized and shaped to receive a soft portion 48. The seal plate 44 and the seal insert 46 forming a rigid hard portion of the seal plate 44 may be made from any suitable rigid and hard material that is not deformable under pressure. The soft portion 48 may be made from any material that is soft, pliant and elastically deformable. Preferably, the soft portion 48 is made from a material that is heat resistant. The soft portion 48 is adapted to fit within the cutout 49 and is located between the hard portions of the seal plate 44 formed by the seal insert 46. Optionally, each seal insert 46 may include a step 45 at a top end of the seal insert 46 that creates a larger cross-sectional area in the cutout 49 than at a bottom end of the cutout 49. Hence, the step 45 secures the soft portion 48 on the seal plate 44 when pressure is applied onto the soft portion 48 in order to compress it during bonding.

The diaphragm 42 may be sandwiched between the seal plate shoulder 41 and the seal plate 44 covering an upper side of the seal plate 44. The diaphragm 42 is elastic, so as to allow effective and uniform transmission of pressure onto the seal plate 44 and the soft portion 48. When a pressure is exerted on the diaphragm 42, the pressure exerted by the soft material 48 across the semiconductor devices 50 located on the bottom side of the seal plate 44 may be substantially uniform.

Figure 4A:
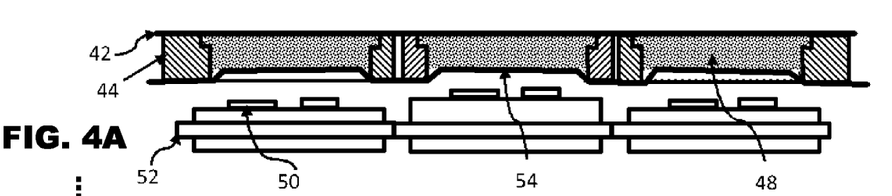
FIGS. 4A to 4C are side views of the seal plate assembly, as it moves between different positions to bond multiple semiconductor devices onto a panel substrate.
Figure 4B:
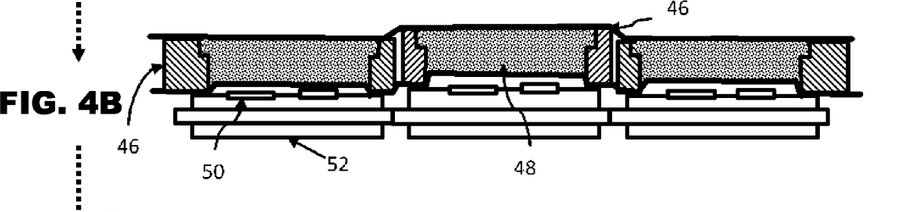
Figure 4C:
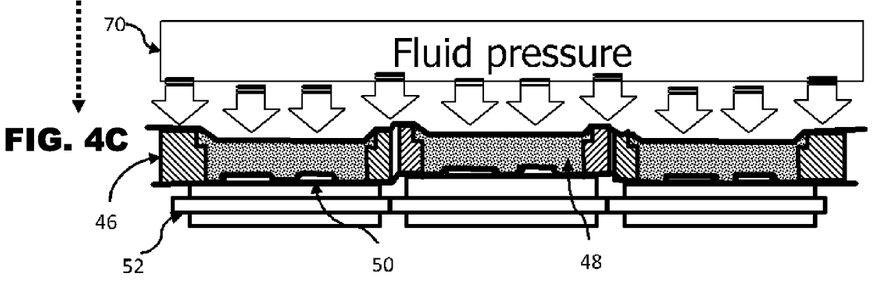

FIGS. 4A to 4C are side views of the seal plate assembly 40, as it moves between different positions to bond multiple semiconductor devices 50 onto a panel substrate 52. As a fluid pressure may be exerted directly on the diaphragm 42 to compress the soft portions 48 without the use of the stamp 32, the stamp holder assembly 30 and stamp 32 are not illustrated in FIGS. 4A to 4C. In the example illustrated in FIG. 4A, the substrate in the form of a panel substrate 52 is not separated. The panel substrate 52 has different heights along its length. In a first position (shown in FIG. 4A), the seal plate 44 is spaced from the substrate 52.

FIG. 4B illustrates a second position wherein the seal plate 44 has moved vertically downwards towards the panel substrate 52 until a bottom surface of the seal plate 44 is in contact with the panel substrate 52. In this example, the seal inserts 46 that contact the panel substrate 52 are at different heights along the length of the panel substrate 52. Each seal insert 46 of this embodiment is able to move independently of other seal inserts 46 and is displaceable relative to the other seal inserts 46 when it is in contact with the panel substrate 52. This allows a user to assign each seal insert 46 to apply sintering pressure to a specific area. In the second position, the soft portion 48 does not yet contact the semiconductor device 50 supported on the panel substrate 52 prior to conducting bonding. It is further noted that each seal insert 46 includes a cutout 49 to receive a soft portion 48 within the cutout 49.

Next, a fluid pressure generator 70 exerts a positive pressure onto the diaphragm 42, which in turn transmits the pressure to the diaphragm 42. The diaphragm 42 then uniformly transmits the pressure onto the seal inserts 46 and the soft portions 48 of the seal plate 44. The fluid pressure generator 70 may be a pneumatic air actuator or a hydraulic pump. The advantages of utilizing a fluid pressure generator 70 is that the usage of the fluid pressure generator 70 is more precise and is capable of greater pressure uniformity.

The uniform pressure exerted onto the soft portions 48 causes the flexible soft portion to be compressed until bottom surfaces of the soft portions 48 are in contact with the multiple semiconductor devices 50 and the panel substrate 52, as shown in FIG. 4C. The said pressure creates bonding forces which are applied onto the multiple semiconductor devices 50 during bonding. The semiconductor devices 50 are thus bonded onto the panel substrate 52. Hence, the preferred embodiment advantageously allows the apparatus 20 to be used on a panel substrate 52 with varying heights along its length during a bonding process, while ensuring that a uniform pressure is exerted across the respective soft portions 48 and therefore, a uniform bonding force can be applied onto all the semiconductor devices 50 during bonding. A release film 54 may be placed at the bottom of the seal plate 44 to physically separate the semiconductor devices 50 from the soft portions 48, and the seal inserts 46 from the panel substrate 52. The release film 54 aids in the separation of the seal plate 44 from the panel substrate 52 after the bonding process is completed.

A pressure sensor (not shown in FIG. 4) may be operatively connected to the seal plate 44 to measure and monitor the pressure that is exerted by the seal plate 44. The pressure sensor may be configured to monitor the pressure in the seal plate 44 throughout the bonding process as the seal plate 44 moves between the first and the second positions, until the point when bonding of the semiconductor devices 50 is completed. This allows the pressure exerted by or acting on the seal plate 44 to be monitored in real time and for any adjustments to be made in real time as necessary. The pressure sensor may also be used to measure and monitor pressure exerted at each active area. The pressure sensor may be any suitable pressure sensor, but should preferably be able to withstand high temperatures.

Figure 5A:
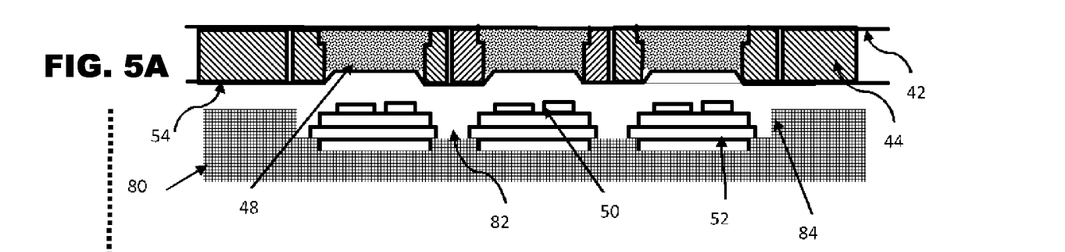
FIGS. 5A to 5C are side views of the seal plate assembly as it moves between different positions to bond multiple semiconductor devices onto multiple singulated substrates.
Figure 5B:
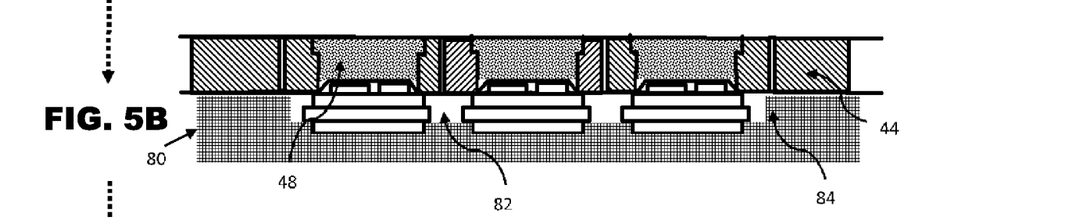
Figure 5C:
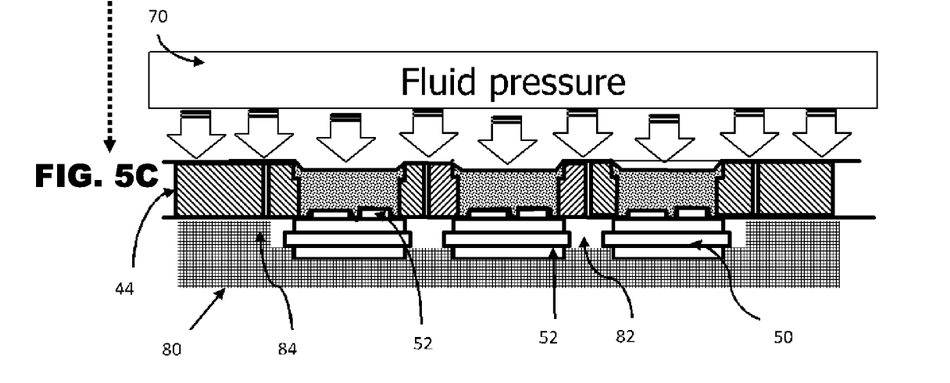

The apparatus 20 of the first preferred embodiment may also be used to bond semiconductor devices on substrates 52 in the form of singulated wafers or panels. FIGS. 5A to 5C are side views of the seal plate assembly as it moves between different positions to bond the semiconductor devices onto one or more singulated substrates 52. As shown in FIG. 5A, the substrates 52 have been separated and are spaced from one another while they are supported on a carrier or platform 80 during bonding. Each singulated substrate 52 holds one or more semiconductor devices 50. The platform 80 may have a recessed portion 82 as defined within by a step 84. The recessed portion 82 of the platform 80 is adapted to receive the singulated substrates 52. At a first position (shown in FIG. 5A), the seal plate 44 is spaced from the substrate 52.

FIG. 5B illustrates a second position whereat the seal plate 44 has moved vertically downwards until a bottom side of the seal plate 44 is in contact with the substrate 52. The bottom side of the seal plate 44 may also contact the step 84 in the second position, such that the seal inserts 46 contact both the platform 80 and the panel substrate 52 simultaneously. Top surfaces of the singulated substrates 52 are substantially at a same height as top surfaces of the platform 80 at the step 84 to enable the seal plate 44 to simultaneously contact the singulated substrates 52 and the platform 80 In the illustrated example, the height of each singulated substrate 52 is approximately the same. However, as with the previous example illustrated in FIG. 4B, a skilled person in the art would understand that if the height of the each singulated substrate 52 is different, the seal inserts 46 are also displaceable relative to one another as described previously. In the second position, the soft portion 48 does not yet contact the semiconductor devices 50 supported on the singulated substrate 52 prior to conducting bonding.

Next, the fluid pressure generator 70 exerts a positive pressure onto the diaphragm 42. The diaphragm 42 then transmits a uniform pressure onto the seal plate 44 and the soft portions 48. The uniform pressure exerted onto the soft portions 48 compresses the flexible soft portions 48 until the soft portions 48 are in contact with the semiconductor devices 50 and the singulated substrates 52, as shown in FIG. 5C. The said pressure causes a bonding force to be applied onto the semiconductor devices 50 during bonding. The semiconductor devices 50 are thus bonded onto the singulated substrates 52.

Figure 6:
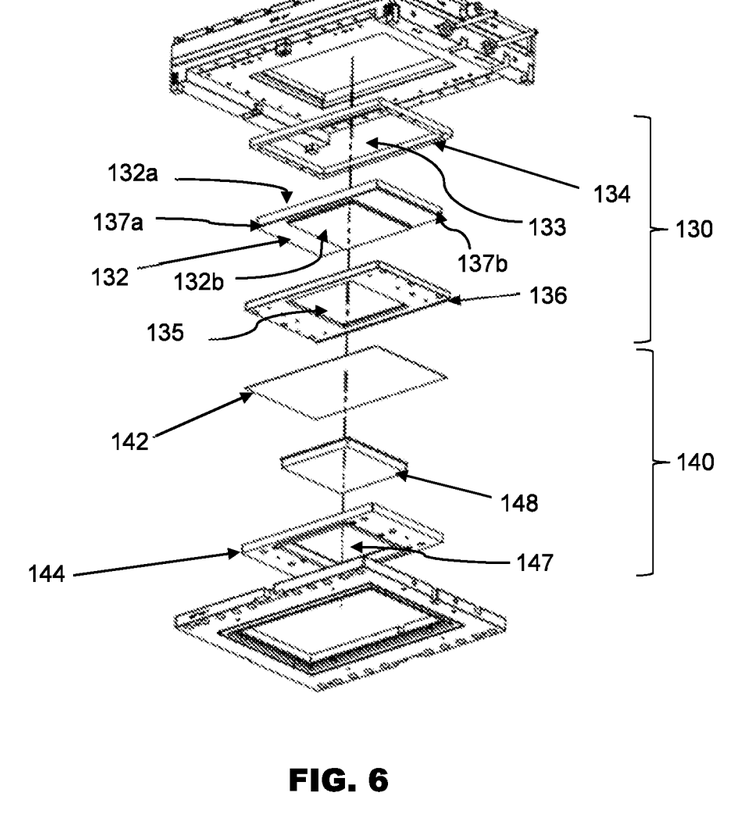
FIG. 6 is an exploded isometric view of a stamp holder assembly and a seal plate assembly according to a second preferred embodiment of the invention.

FIG. 6 is an exploded isometric view of a stamp holder assembly 130 and a seal plate assembly 140 according to a second preferred embodiment of the invention. The second preferred embodiment is different from the first preferred embodiment in that there is a single soft portion 148 having a unitary flat body that is fitted in a single cutout in the seal plate 144 in the second preferred embodiment. In the second preferred embodiment of the invention, the stamp holder assembly 130 (which is optional for the operation of the apparatus) includes a stamp 132 having a single stamping surface. The stamp 132 may have an upper portion 132a and a lower portion 132b below the upper portion 132a. The lower portion 132b of the stamp 132 is proximate the seal plate assembly 140. Preferably, the upper portion 132a has a larger surface area than the lower portion 132b. This advantageously allows an enhancement of the pressure exerted on the seal plate assembly 140.

The stamp holder assembly 130 further comprises a stamp holder sleeve 134 and a stamp holder body 136. The stamp holder sleeve 134 has a slot 133 within which the upper portion 132a of the stamp 132 is movable. The stamp holder body 136 is mounted beneath the stamp holder sleeve 134 and has a recess 135 that is adjacent to the lower portion 132b of the stamp 132.

A collar 137 is located adjacent to a base of the upper portion 132a of the stamp 132. The stamp 132 is configured to be movable in vertical directions towards or away from a substrate. The collar 137 ensures that the movement of the stamp 132 is delimited within the recess 135. During movement of the stamp 132 vertically away from the substrate, an upper end of the collar 137 will contact a bottom face of the stamp holder sleeve 134, thus preventing the stamp 132 from moving further upwards. When the stamp 132 is moving downwards towards the substrate, a lower end 137b of the collar 137 will be stopped from further movement when it contacts a top face of the stamp holder body 136. This prevents the stamp 132 from moving further downwards towards the substrate.

The seal plate assembly 140 is positioned between the stamp holder assembly 130 and the substrate. The seal plate assembly 140 includes a seal plate 144. The seal plate 144 may have an opening 147 that is suitably sized and shaped to receive the single soft portion 148. The seal plate 144 may be made from any hard material that is not deformable under pressure. The soft portion 148 may be made from any material that is soft, pliant and elastically deformable. The soft portion 148 is preferably made from a material that is heat resistant. The soft portion 148 is adapted to fit within the opening 147 of the seal plate 144. A diaphragm 142 is sandwiched between the stamp holder body 136 and the seal plate 144. The diaphragm 142 is elastic and the elasticity of the diaphragm 142 allows uniform transmission of pressure to the seal plate 144 and soft portion 148. When a pressure is exerted on the diaphragm 142, the soft portion 148 exerts substantially the same pressure across all the semiconductor devices.

Figures 7A, 7B:
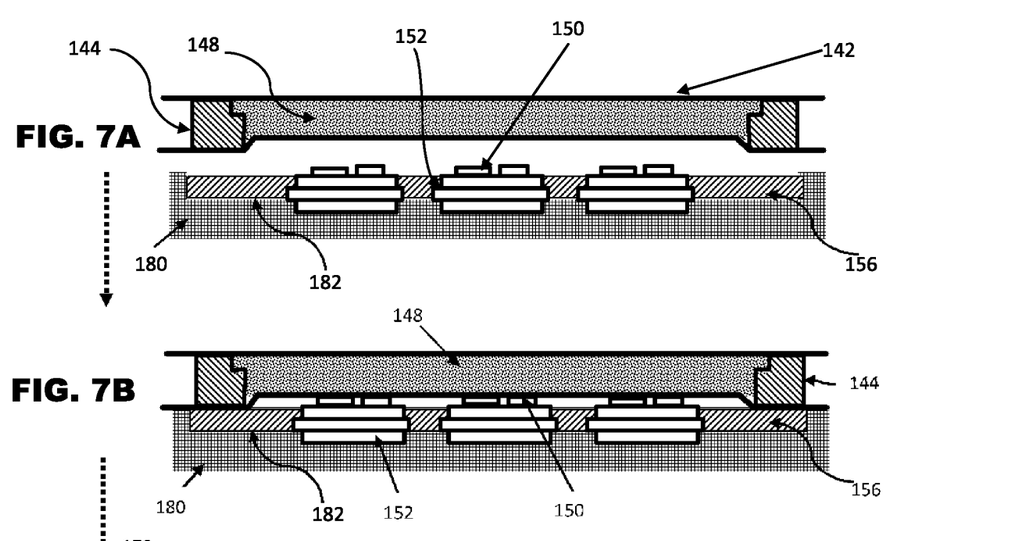
FIGS. 7A to 7C are side views of the seal plate assembly as it moves between different positions to bond multiple semiconductor devices onto multiple singulated substrates.
Figure 7C:
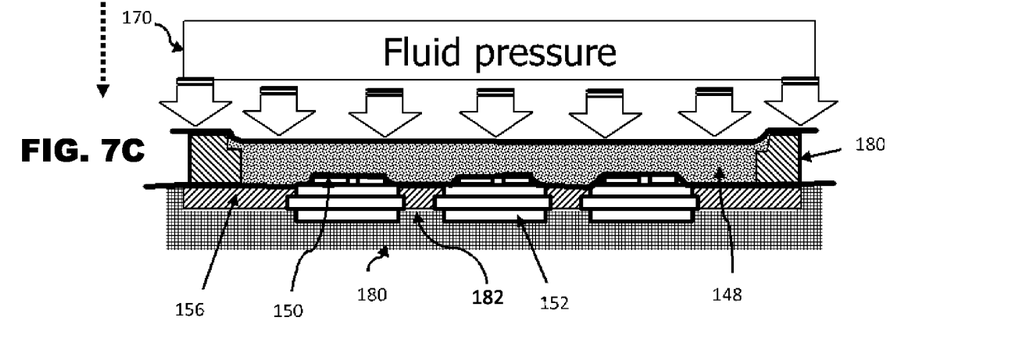

FIGS. 7A to 7C are side views of the seal plate assembly as it moves between different positions to bond the semiconductor devices 150 supported on multiple singulated substrates 152. As shown in FIG. 7A, the singulated substrates 152 have been separated and are supported on a carrier or platform 180. Each singulated substrate 152 holds one or more semiconductor devices 150. The platform 180 may have a recessed portion 182 therein and is adapted to receive multiple singulated substrates 152. The seal plate 144 and the soft portion 148 are spaced from the singulated substrates 152 (shown in FIG. 7A). The singulated substrates 152 may be positioned on the platform 180 by way of a holding plate 156 affixed onto the singulated substrates 152 with the singulated substrates 152 exposed via through holes formed in the holding plate 156. The holding plate 156 is placed into the recessed portion 182 of the platform 180 on top of the singulated substrates 152 and firmly supports and secures each singulated substrate 152 in place on the platform 180.

FIG. 7B illustrates a second position whereat the seal plate 144 has moved vertically downwards until a bottom side of the seal plate 144 is in contact with the holding plate 156. Next, a fluid pressure generator 170 exerts a positive pressure onto the diaphragm 142. The diaphragm 142 then transmits the pressure uniformly onto the soft portion 148 of the seal plate 144, of which the soft portion 148 comprises a unitary flat body. The unitary flat body of the soft portion 148 is received within a single cutout that is formed in the seal plate 144. The fluid pressure generator 170 may be a pneumatic air actuator or a hydraulic pump.

The uniform pressure exerted onto the soft portion 148 causes the flexible soft portion 148 to be compressed until the soft portion 148 is in contact with all the semiconductor devices 150, the singulated substrates 152 and the holding plate 156 as shown in FIG. 7C. The said pressure causes a bonding force to be applied onto the semiconductor devices 150 during bonding. The semiconductor devices 150 are thus bonded onto the singulated substrates 152. A release film 154 may be placed at the bottom of the seal plate 144 and the soft portion 148, above the semiconductor devices 150 and singulated substrates 152.

In the example shown in FIG. 7B, the seal plate 144 is shown to be in contact with both the singulated substrates 152 and the holding plate 156 at the second position. However, the seal plate 144 may also be arranged as shown in FIG. 8, where it is only in contact with the platform 180.

Figure 8:
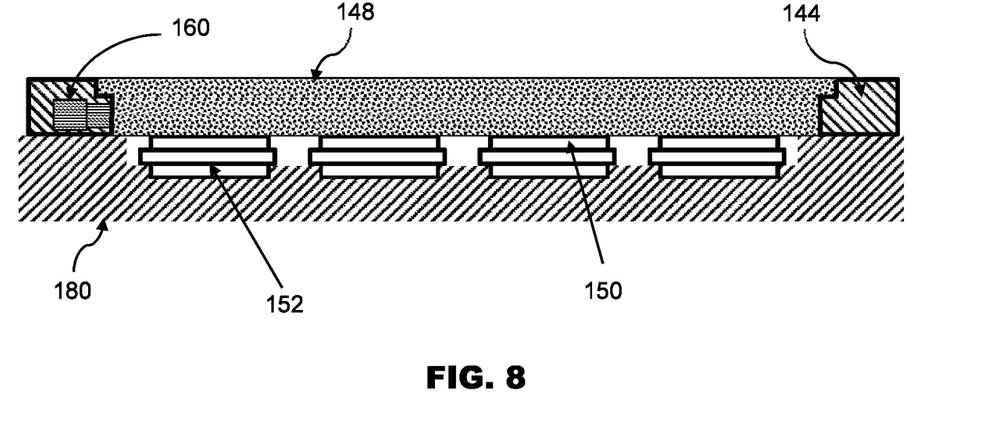
FIG. 8 is a side view of the seal plate assembly incorporating a pressure sensor attached to the seal plate of the second preferred embodiment of the invention.

FIG. 8 is a side view of the seal plate assembly incorporating a pressure sensor 160 attached to the seal plate 144 of the second preferred embodiment of the invention. In the second position of the seal plate 144 in the second preferred embodiment as shown in FIG. 8, the rigid hard portions of the seal plate 144 are only in contact with the platform 180 but not the singulated substrates 152. The pressure sensor 160 may be incorporated in the seal plate 144 to measure and monitor the pressure that is exerted on or by the seal plate 144. The pressure sensor 160 may be configured to monitor the pressure in the seal plate 144 throughout the entire bonding process as the seal plate 144 moves between the first and the second positions, until the point when bonding of the semiconductor devices 150 has completed. This allows a user to monitor the pressure in real time and to make any adjustments to the pressure as necessary. The pressure sensor 160 may be any suitable pressure sensor, but should be able to withstand high temperatures.

Figure 9:
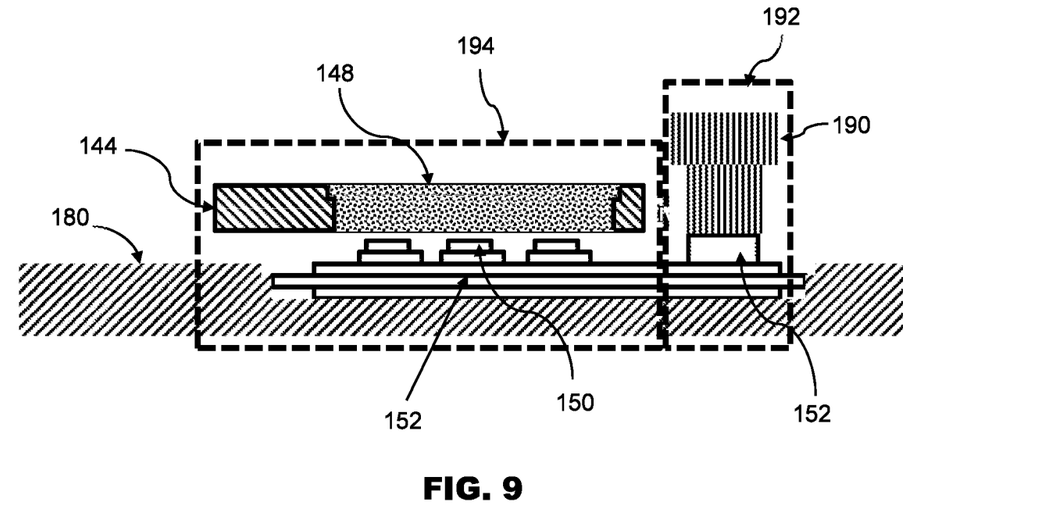
FIG. 9 is a side view of an apparatus for bonding semiconductor devices to a substrate, the apparatus having a soft tool section and a hard tool section.

FIG. 9 is a side view of an apparatus for bonding semiconductor devices 150 to a substrate 152, the apparatus having a soft tool section 194 and a hard tool section 192. In many bonding applications, it may sometimes be necessary to bond stacked semiconductor devices together. Such semiconductor devices may include DTS chips, or multiple die stacked on top of one another. In such instances, the seal plate 144 contacts the substrate 152 and the platform 180 in its second position. The pressure exerted across the soft portion 148 will in turn be applied uniformly across all the semiconductor devices 150. The flexible soft portion 148 of the seal plate 144 thus makes it possible to bond or sinter the stacked semiconductor devices 150 on the substrate 152 in a single step.

Where the semiconductor device 150 is a thick die (such as an NTC chip) that cannot be reliably bonded or sintered by the soft portion 148, a non-flexible hard tool 190 in the hard tool section 192 may be beneficially provided to the apparatus of the invention. Such an apparatus would comprise both the soft tool section 194 (incorporating the seal plate 144 and soft portion 148) and the hard tool section 192 (which uses a suitable hard tool 190). This allows bonding or sintering to be carried out at the same time on a substrate holding semiconductor devices 150 of different types and thicknesses.

The described embodiments of the present invention have multiple advantages over the prior art. For example, through the use of the seal inserts 144 and the one or more soft portions 148, a user is now able to assign specific areas to selectively apply bonding or sintering pressure. Moreover, the sealing by the diaphragm over the seal plate 144 and the soft portion 148 ensures that the soft portion 148 is confined within the recess defined in the seal inserts 146. Hence, the soft portion 148 does not suffer from bleeding out from any gap formed between the seal plate 144 and stamp 132. At the same time, it is possible to achieve a substantially uniform sintering pressure across all the semiconductor devices 150. Further, the described embodiments allow the use of a combination of a hard tool section 192 and a soft tool section 194, which would be beneficial for applications that require the use of both tools.

Although the present invention has been described in considerable detail with reference to certain embodiments, other embodiments are possible. For instance, instead of the substrate 52, 152 being supported below the seal plate 144 as described above, the substrate 52, 152 may also be supported above the seal plate 144 so that the seal plate 144 moves upwards from a first position to a second position to contact the substrate 52, 152 and/or platform 180.

Therefore, the spirit and scope of the appended claims should not be limited to the description of the embodiments contained herein.

The invention claimed is:

1. Apparatus for bonding at least one semiconductor device onto a substrate that is supported on a platform, the apparatus comprising:
    a seal plate including rigid hard portions and one or more flexible soft portions located between the hard portions, the seal plate having a first side which is configured to be in contact with the substrate in use when the substrate is supported on the platform;
    a diaphragm covering a second side of the seal plate opposite to the first side;
    a fluid pressure generator that is in fluid communication with the diaphragm, the fluid pressure generator being operative to exert a fluid pressure onto the diaphragm, the fluid pressure being further operative to actuate the diaphragm to compress the one or more soft portions, whereby to contact the at least one semiconductor device with the one or more soft portions and to apply a bonding force onto the at least one semiconductor device during bonding; and
    the seal plate is movable between a first position which is spaced from the substrate, and a second position whereat a first side of the seal plate is configured to be in contact with the substrate in use whereby the fluid pressure is further configured to be applied by the diaphragm onto the hard portions of the seal plate against the substrate.

2. Apparatus as claimed in claim 1, wherein the hard portions on the first side of the seal plate are in contact with the substrate at the second position.

3. Apparatus as claimed in claim 1, wherein the hard portions on the first side of the seal plate are in contact with the platform and the soft portions on the first side of the seal plate are in contact with the substrate at the second position.

4. Apparatus as claimed in claim 1, wherein the rigid hard portions are comprised in a plurality of seal inserts, each seal insert including a cutout that is sized and shaped to receive a soft portion.

5. Apparatus as claimed in claim 4, further comprising a step at a top end of the seal insert that creates a larger cross-sectional area in the cutout than at a bottom end of the cutout, for securing the soft portion in the cutout when the soft portion is compressed during bonding.

6. Apparatus as claimed in claim 4, wherein each seal insert is displaceable relative to another seal insert when the seal inserts are in contact with the substrate.

7. Apparatus as claimed in claim 4, wherein the seal inserts are operative to contact both the platform and the substrate simultaneously.

8. Apparatus as claimed in claim 1, further comprising one or more stamps arranged on the second side of the seal plate to contact the diaphragm, the or each stamp being located between the fluid pressure generator and the diaphragm for transmitting pressure from the fluid pressure generator to the one or more soft portions.

9. Apparatus as claimed in claim 8, wherein the one or more stamps further comprise at least a first portion acted upon by the fluid pressure generator and a second portion operative to contact the diaphragm, the first portion having a larger surface area than the second portion.

10. Apparatus as claimed in claim 8, wherein the stamp further includes a collar extending from the stamp, the collar being configured to contact top and bottom surface of a recess located within a slot along which the stamp is slidable, the recess further defining a range of motion of the collar and the stamp relative to the substrate.

11. Apparatus as claimed in claim 1, wherein the substrate comprises a plurality of singulated substrates that are spaced from one another on the platform during bonding.

12. Apparatus as claimed in claim 11, wherein the platform includes a recessed portion in which the singulated substrates are received, such that top surfaces of the singulated substrates are substantially at a same height as top surfaces of the platform, and the seal plate is configured to contact the singulated substrates and the platform substantially simultaneously.

13. Apparatus as claimed in claim 12, further comprising a holding plate affixed in the recessed portion, the holding plate containing through holes for supporting the singulated substrates that are received in the recessed portion.

14. Apparatus as claimed in claim 1, wherein the seal plate has a single cutout that is sized and shaped to receive a single unitary flat soft portion for applying a uniform bonding force onto all the semiconductor devices on the substrate.

15. Apparatus as claimed in claim 14, wherein the rigid hard portions of the seal plate contact only the platform during bonding, whereas the unitary flat soft potion contacts the semiconductor devices and the substrate.

16. Apparatus as claimed in claim 1, wherein the soft portions are comprised in a soft tool section, and the apparatus further includes a hard tool section incorporating a non-flexible hard tool to apply a bonding pressure onto a further one or more semiconductor devices that are mounted on the substrate.

17. Apparatus as claimed in claim 1, further comprising a pressure sensor incorporated in the seal plate for measuring a pressure that is exerted by the seal plate.

18. Apparatus as claimed in claim 1, further comprising a release film positioned adjacent to the seal plate between the at least one semiconductor device and the one or more soft portions.

* * * * *